US008518808B2

(12) United States Patent
Feigelson et al.

(10) Patent No.: US 8,518,808 B2
(45) Date of Patent: Aug. 27, 2013

(54) DEFECTS ANNEALING AND IMPURITIES ACTIVATION IN III-NITRIDE COMPOUND

(75) Inventors: Boris N. Feigelson, Springfield, VA (US); Travis Anderson, Alexandria, VA (US); Francis J. Kub, Arnold, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/234,699

(22) Filed: Sep. 16, 2011

(65) Prior Publication Data

US 2012/0068188 A1   Mar. 22, 2012

Related U.S. Application Data

(60) Provisional application No. 61/383,748, filed on Sep. 17, 2010.

(51) Int. Cl.
*H01L 21/20*   (2006.01)

(52) U.S. Cl.
USPC ........... 438/502; 438/506; 438/509; 438/483; 257/E21.077

(58) Field of Classification Search
USPC ................ 438/483, 501, 502, 506, 508, 509, 438/518; 257/E21.077
See application file for complete search history.

(56) References Cited

U.S. PATENT DOCUMENTS

| 5,468,678 | A * | 11/1995 | Nakamura et al. | 438/509 |
|---|---|---|---|---|
| 7,977,224 | B2 * | 7/2011 | Hager et al. | 438/522 |
| 2006/0286784 | A1 * | 12/2006 | Usov et al. | 438/515 |
| 2009/0121320 | A1 * | 5/2009 | Tsuda et al. | 257/613 |
| 2010/0147835 | A1 * | 6/2010 | Mulpuri et al. | 219/759 |

OTHER PUBLICATIONS

Nogales et al., "Failure mechanism of AlN nanocaps used to protect rare earth-implanted GaN during high temperature annealing," Appl. Phys. Lett. 88, 031902 (2006).*
K.T. Liu et al., "Crystal Polarity Effects on Magnesium Implantation into GaN Layer," Japanese Journal of Applied Physics, 2010, 49(7).
H. Alves et al., "Mg in GaN: the structure of the acceptor and the electrical activity," 2003, WILEY-VCH Verlag. p. 1770-1782.
S. Porowski et al., "Annealing of GaN under high pressure of nitrogen," Journal of Physics: Condensed Matter, 2002. 14(44): p. 11097-11110.
Y. Irokawa et al., "Electrical characteristics of GaN implanted with Si+ at elevated temperatures," Applied Physics Letters, 2005, 86(11): p. 112108.

(Continued)

*Primary Examiner* — Julia Slutsker
(74) *Attorney, Agent, or Firm* — Amy Ressing; Joslyn Barritt

(57) ABSTRACT

A GaN sample in a sealed enclosure is heated very fast to a high temperature above the point where GaN is thermodynamically stable and is then cooled down very fast to a temperature where it is thermodynamically stable. The time of the GaN exposure to a high temperature range above its thermodynamic stability is sufficiently short, in a range of few seconds, to prevent the GaN from decomposing. This heating and cooling cycle is repeated multiple times without removing the sample from the enclosure. As a result, by accumulating the exposure time in each cycle, the GaN sample can be exposed to a high temperature above its point of thermodynamic stability for a long time but the GaN sample integrity is maintained (i.e., the GaN doesn't decompose) due to the extremely short heating duration of each single cycle.

37 Claims, 9 Drawing Sheets

(56) References Cited

OTHER PUBLICATIONS

S. Matsunaga et al., "Silicon implantation in epitaxial GaN layers: Encapsulant annealing and electrical properties," Journal of Applied Physics, 2004, 95(5): p. 2461-2466.

X. Cao et al., "Redistribution of implanted dopants in GaN," Journal of Electronic Materials, 1999, 28(3): p. 261-265.

G.S. Aluri et al., "Microwave annealing of Mg-implanted and in situ Be-doped GaN," Journal of Applied Physics, 2010, 108(8): p. 083103.

K.T. Liu et al., "Magnesium/nitrogen and beryllium/nitrogen coimplantation into GaN," Journal of Applied Physics, 2005, 98(7): p. 073702-5.

C.E. Hager et al., "Activation of ion implanted Si in GaN using a dual AlN annealing cap," Journal of Applied Physics, 2009: p. 033713.

J.A. Freitas, Jr. et al., "Donor-related recombination processes in hydride-vapor-phase epitaxial GaN," Phys. Rev. B. 66 (2002) 233311.

M. Murthy et al., "Residual impurities in GaN substrates and epitaxial layers grown by various techniques," J. Crystal Growth 305 (2007) 393.

M.A. Reshchikov et al., "Luminescence properties of defects in GaN," J. Appl. Phys. 97 (2005) 061301.

A.E. Wickenden et al., "The Influence of OMVPE Growth Pressure on the Morphology, Compensation, and Doping of GaN and Related Alloys," J. Electron. Mat. 29 (2000) 21, R114.

R. Armitage et al., "Analysis of the carbon-related "blue" luminescence in GaN," J. Appl. Phys., 97 (2005) 073524.

W.H. Sun et al., "Outgoing multiphonon resonant Raman scattering and luminescence in Be- and C-implanted GaN," J. Appl. Phys. 91 (2002) 4917.

B. Monemar et al., "Evidence for Two Mg Related Acceptors in GaN," Phys. Rev. Lett. 102 (2009) 235501.

* cited by examiner

DEFECTS ANNEALING AND IMPURITIES ACTIVATION IN III-NITRIDE COMPOUND

CROSS-REFERENCE

This application claims the benefit of priority based on U.S. Provisional Patent Application No. 61/383,748 filed on Sep. 17, 2010, the entirety of which is hereby incorporated by reference into the present application.

TECHNICAL FIELD

The present invention relates to III-nitride semiconductors and methods of annealing defects and activating impurities therein.

BACKGROUND

Wide-bandgap materials, notably GaN, offer high breakdown field and carrier mobility, as well as chemical and thermal stability. Consequently, devices employing this material have applications in high power switching circuits, as well as high frequency amplifiers. A significant performance- and reliability-limiting factor is the high defect densities that result from heteroepitaxy on SiC, Si, or sapphire substrates due to the lack of readily-available bulk GaN. Furthermore, the lack of a controllable p-type doping process significantly limits the circuit applications, since complimentary transistors and diodes cannot be built. Therefore, there is a need for a method to reduce the defect density and/or improve dopant activation A reliable ion implantation process would be beneficial for GaN device manufacturing, as it would enable selective area n- and p-type doping. See K. T. Liu et al., "Crystal Polarity Effects on Magnesium Implantation into GaN Layer," Japanese Journal of Applied Physics, 2010, 49(7). To realize such a process, post-implantation damage removal and electrical activation by annealing are critical steps to achieving a high quality GaN crystal with high mobility and high carrier concentration.

To date, a common problem in GaN device technology has been the low yield of activation of uncompensated Mg acceptors. Achieving a sufficient p+ hole concentration requires an adequate high temperature annealing of defects in the GaN after implantation.

Annealing structural defects in GaN is a challenging task because of the thermodynamic instability of GaN at high temperatures. Equilibrium nitrogen pressure above GaN increases quickly with temperature, and exceeds 1 bar at 850° C. (only ⅓ of the melting point). At the same time, it is known that estimated annealing temperature required for sufficient diffusion is about ⅔ of the melting point of the material, e.g., about 1400-1500° C. in the case of GaN. See S. J. Pearton et al., "Ion Implantation in Group III Nitrides," Comprehensive Semiconductor Science and Technology, 2011, Elsevier: Amsterdam, pp. 25-43.

Annealing GaN at these temperatures can remove defects induced by the implantation, and move implanted Mg impurities to the proper lattice sites to substitute for Ga, making them electrically active. See H. Alves et al., "Mg in GaN: the structure of the acceptor and the electrical activity," 2003, WILEY-VCH Verlag. p. 1770-1782. However, to prevent GaN dissociation at 1500° C., a nitrogen pressure of at least 15 kbar is needed. See S. Porowski et al., "Annealing of GaN under high pressure of nitrogen," Journal of Physics: Condensed Matter, 2002. 14(44): p. 11097-11110, showing that annealing of GaN is possible without surface degradation at temperatures up to 1500° C. under $N_2$ pressure of 16 kbar. According to the photoluminescence (PL) spectra, magnesium was optically activated after the implantation when annealed above 1300° C., and optical activity increased with increasing annealing temperature up to 1500° C. Id.

Rapid Thermal Annealing (RTA) is a commonly used technique for electrical activation of dopants after implantation in many semiconductor materials. In the case of GaN, RTA permits annealing of GaN at temperatures above its thermal stability without apparent GaN decomposition. If GaN is annealed at high temperatures for a short time, only a small amount of nitrogen has time to leave the surface of GaN, while the material in bulk remains unaffected. To prevent nitrogen loss from the surface during RTA and to keep the GaN surface from degrading, one can use an annealing cap on the top of GaN. Different materials, such as $SiO_2$, $Si_3N_4$, and AlN have been used as caps in studies of GaN high temperature annealing. See, e.g., Y. Irokawa et al., "Electrical characteristics of GaN implanted with $Si^+$ at elevated temperatures," Applied Physics Letters, 2005, 86(11): p. 112108; S. Matsunaga et al., "Silicon implantation in epitaxial GaN layers: Encapsulant annealing and electrical properties," Journal of Applied Physics, 2004, 95(5): p. 2461-2466; and X. Cao et al., "Redistribution of implanted dopants in GaN," Journal of Electronic Materials, 1999, 28(3): p. 261-265.

A combination of RTA and GaN capping with AlN has been shown to be an effective method for heating GaN up to 1500° C. for very short times without losing nitrogen from its surface. See G. S. Aluri et al., "Microwave annealing of Mg-implanted and in situ Be-doped GaN," Journal of Applied Physics, 2010, 108(8): p. 083103. However, no electrical activation was demonstrated in Mg implanted samples even after 15 seconds of annealing at 1500° C. due to the high residual implant damage remaining in the material. Id.

The motivation for this invention came from the understanding that GaN annealing is a serious hurdle in the development of a large variety of GaN based devices Annealing at high $N_2$ pressure allows the heating of GaN at high temperatures with the GaN being thermodynamically stable for a long time without GaN dissociation, but the use of such high gas pressures requires unique high pressure equipment and time-consuming procedure to load samples and apply high $N_2$ pressure. This makes high-pressure annealing too expensive for industry and difficult to scale up to lager wafer sizes.

RTA allows annealing of GaN at temperatures above GaN stability and therefore is an attractive technique for GaN annealing in terms of achievable temperatures and costs. However, it has not been shown that RTA enables electrical activation of Mg after the implantation in GaN without co-doping with other ions. See K. T. Liu et al., "Magnesium/nitrogen and beryllium/nitrogen coimplantation into GaN," Journal of Applied Physics, 2005, 98(7): p. 073702-5. One reason for these unsuccessful attempts of using RTA to activate the implanted Mg is the short duration of the GaN annealing at sufficiently high temperatures. A new technique is required to enable a long duration annealing at high temperatures above thermal stability of GaN. Mg-implanted electrical activation and demonstration of the p-type conductivity with use of a new annealing technique would be a strong evidence of the efficiency of this technique.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method for annealing III-nitride semiconductors such as GaN, InN, AlN, and their alloys.

More specifically, the present invention provides a method for annealing defects in III-nitride semiconductors after the ion implantation of the dopant impurities Annealing restores the crystal lattice damaged by the implantation and moves the implanted impurities to the proper lattice sites to make them electrically and optically active.

In accordance with the present invention, a sample of a III-nitride semiconductor such as GaN is placed in an enclosure which is filled with an inert gas or ammonia.

The sample is heated very fast to a high temperature above the point of GaN thermodynamic stability and is then cooled down very fast to a temperature where the GaN is thermodynamically stable. The total time of the GaN exposure to a high temperature range above GaN thermodynamic stability is sufficiently short, in a range of few seconds, to prevent the GaN from decomposing. This heating and cooling cycle is repeated multiple times without removing the sample from the enclosure.

As a result, by accumulating the exposure time in each cycle, the GaN sample can be exposed to a high temperature above its point of thermodynamic stability for a long time but the GaN sample integrity is maintained (i.e., the GaN doesn't decompose) due to the extremely short heating duration of each single cycle. We describe this process as Multicycle Rapid Thermal Annealing (MRTA)

Along with introduction of the new MRTA method, in some embodiments, the annealing process in accordance with the present invention can include additional elements to enable high temperature annealing of a III-nitride semiconductor such as GaN for extended periods of time without decomposition.

In some embodiments, these elements include capping the III-nitride material with a nitride cap to protect the surface of the III-nitride from degrading and applying a gas overpressure, e.g., in the range of about 1 bar to about 20 kbar, to increase the temperature at which the sample can be annealed. In some embodiments, these elements include use of a two-step annealing process, in which a III-nitride semiconductor implanted with dopant ions is subjected to Long Time Annealing (LTA) before the MRTA step.

The result of the invented process is an electrically activated Mg-implanted GaN with high p-type conductivity.

DETAILED DESCRIPTION

Figure 1:
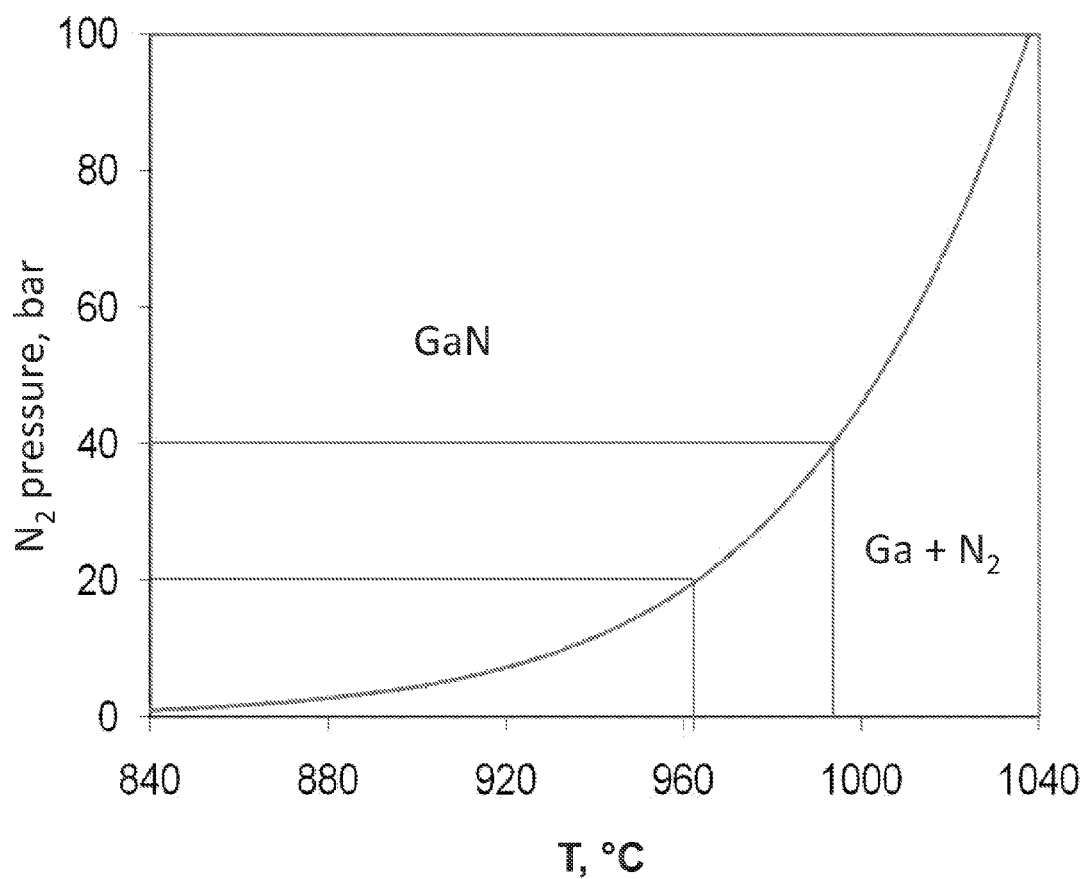
FIG. 1 is a phase diagram for GaN, showing the temperatures and pressures at which GaN is stable.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides methods for annealing defects and activating impurities in III-nitride semiconductors such as GaN, InN, AlN, and their alloys.

More specifically, the present invention provides a method for annealing defects in III-nitride semiconductors after ion implantation of dopant impurities Annealing restores crystal lattice damaged by the implantation and moves implanted impurities to the proper lattice sites to make them electrically and optically active. It should be noted that although the present invention is described in the context of an exemplary implementation involving annealing of Mg-implanted GaN covered by an AlN cap, other combinations may be made within the scope and spirit of the present invention. For example, other III-nitride semiconductors that can be treated with the method according to the present invention include InN, AlN, and their alloys, and other dopants can include any element of the Periodic table. In addition, the material used for the cap may vary depending on the thermal properties of the III-nitride material, and any suitable material that is thermally stable at the desired annealing temperatures can be used.

The present invention introduces a new annealing technique, termed Multicycle Rapid Thermal Annealing (MRTA). The method of the present invention may be briefly described as follows. First, a III-nitride semiconductor such as GaN is placed inside an enclosure with an inert atmosphere and then is annealed for a very short time at a temperature above GaN thermodynamic stability. With a careful choice of the temperature and heating duration, it is possible to avoid decomposition of the GaN. After cooling the sample to a temperature at which it is thermally stable, the same heating step can be repeated without the GaN decomposing. Following this logic, it is possible to anneal the GaN sample many times without removing it from the enclosure while maintaining its thermal stability if at each heating cycle, the time at which it is exposed to temperatures above the GaN stability range is sufficiently short. Thus, in accordance with the present invention, the sample can be rapidly heated to a temperature at which it is thermally unstable for a few seconds, rapidly cooled just to a temperature at which it is thermally stable, and then rapidly heated again. By repeating this process without cooling the sample to room temperature, but just cooling to the temperature where GaN becomes thermodynamically stable, it is possible to rapidly cycle this annealing procedure. In such a process, by accumulating the time of each repetitive heating cycle, the material is exposed to high temperature above GaN thermodynamic stability for a long time, but the stability is maintained due to the short heating duration of each single heating cycle. We describe this process as Multi-cycle Rapid Thermal Annealing (MRTA).

The advantage of the MRTA over the conventional rapid thermal annealing will be demonstrated in detail in the example below. Here we give a short explanation. By using conventional rapid thermal annealing GaN sample can be heated to the temperature T1 above thermodynamic stability of GaN for a period of time t1 (usually seconds) without decomposition of GaN. If this period of time is increased up to t2 (also in the range of seconds), GaN will start to decompose. In the case of the MRTA the same sample can be heated to the same temperature T1 for much longer time (in the range of minutes) than time t2, without decomposition of GaN by means of accumulating the time of the repeated short heating cycles.

As noted above, an annealing cap can be placed on top of the III-nitride semiconductor to prevent nitrogen loss from the surface of a III-nitride semiconductor during conventional rapid thermal annealing at temperatures above its thermodynamic stability and to keep its surface from degrading. For the same reason, in some embodiments, an annealing cap can be used in the MRTA method of the present invention. Generally, so long as the cap maintains its integrity, such a cap can retain nitrogen in the III-nitride semiconductor if it consists of a material thermally more stable than the III-nitride semiconductor and if it is tightly bound to it. In studies of GaN high temperature annealing different materials, such as $SiO_2$, $Si_3N_4$, and AlN have been used as caps. However, as soon as the nitrogen pressure beneath the cap exceeds the mechanical strength of the cap, cracks are formed and nitrogen will escape from the III-nitride semiconductor, so it is important to not build up nitrogen pressure under the cap higher than the strength of the cap.

In some embodiments of an annealing method in accordance with the present invention, an ultrathin high temperature, e.g., about 1000° C., MOCVD AlN cap can be applied to the sample before annealing to protect the surface of GaN during MRTA and to increase a temperature range at which the GaN can be annealed. The choice of the material for the GaN protective cap is based on thermal stability, compatibility of the thermal coefficients of expansion and ability to strong interfacial bonding. AlN has the same crystal structure as GaN, and has been found to protect GaN during annealing better than other tested materials. See C. E. Hager et al., "Activation of ion implanted Si in GaN using a dual AlN annealing cap," *Journal of Applied Physics*, 2009: p. 033713. Sputtered or/and low temperature (LT) CVD AlN is usually used as the cap in gallium nitride annealing experiments. In an exemplary case studied by the inventors herein, the AlN layer was grown by MOCVD at high temperature (HT) to obtain the best interface between GaN and AlN. Because of the relatively large (2.4%) mismatch between GaN and AlN, it is necessary to keep the HT MOCVD AlN cap essentially thin, in the range of few nanometers, for example, about 2-10 nm, so it can be grown crack-free. The high thermal stability of AlN prevents nitrogen sublimation from GaN during the annealing. A flawless, smooth interface between GaN and HT MOCVD AlN is desired to prevent a nitrogen accumulation in micro-voids between two layers.

To further enhance protection of the GaN surface, in some embodiments, a second layer of low temperature, for example, about 700° C., (LT) MOCVD AlN may be grown on top of the HT MOCVD AlN. The second LT MOCVD AlN layer is usually thicker than the HT MOCVD AlN layer, for example, in the range of about 10 to about 1000 nm. This second AlN layer mechanically enforced the first, very thin HT AlN layer, and allows better to withstand nitrogen pressure underneath the cap.

Applying gas pressure inside the enclosure also can expand the temperature range of the thermodynamic stability of GaN so that GaN can be annealed at higher temperatures without its decomposition. It therefore can be beneficial to apply some gas pressure during MRTA because it allows the maximum MRTA temperature to be increased. Any inert gas can be used for the atmosphere inside the enclosure, but nitrogen or ammonia are preferred gases, with nitrogen being more preferred than ammonia. The applied gas pressure can be in the range of about 1 bar to about 20 kbar FIGS. 1-9 illustrate various aspects of methods for annealing III-nitride semiconductor materials in accordance with the present invention.

As it can be seen from the GaN phase diagram shown in FIG. 1, the thermal stability of GaN is most sensitive on pressure increase from 1 to 20 bar. For example, although GaN is not stable above 850° C. at atmospheric pressures (1 bar), dissociating into its constituent elements Ga and $N_2$, the temperature at which it is thermally stable increases as the pressure increases. This change in thermal stability is most sensitive to an increase in pressure from 1 bar to 20 bar, with the thermally stable temperature increasing from about 850° C. at 1 bar up to nearly 970° C. at 20 bar. Put conversely, the application of 20 bar of pressure can increase the thermally stable temperature by 120° C. The application of additional pressure has a smaller and diminishing effect on GaN thermal stability. For example, application of an additional 20 bar of pressure obtains only about a 20-30° C. increase in the thermally stable temperature.

As noted above, it would therefore be efficient to apply 20 bar of $N_2$ pressure to increase GaN annealing temperature by 120° C. without GaN dissociation since it does not require unconventional equipment. However, it is progressively less efficient to continue to increase $N_2$ pressure above 20 bar because the increase in annealing temperature would be disproportionally less and would necessitate more specialized equipment.

Thus, in an exemplary embodiment in accordance with the present invention, a protective cap is applied to the GaN material and the capped GaN is then annealed under about 20 bar of applied $N_2$ pressure. The AlN cap can be applied to a top surface of the GaN by any suitable method such as AlN sputtering or AlN MOCVD growth, though in some cases one or the other method may be preferred. A very thin HT MOCVD AlN cap, e.g., one having a thickness of less than 10 nm, is preferred. In some embodiments, two layers of AlN are preferred to use as a cap for GaN, where the first layer is thin (less than 10 nm) HT MOCVD AlN and the second layer is LT MOCVD AlN which is thicker than HT MOCVD AlN layer. With such a protective cap and 20 bar of applied $N_2$ pressure, GaN can be annealed by MRTA in the range of temperatures up to about 1500° C. without GaN decomposition or surface degradation.

Figure 2:
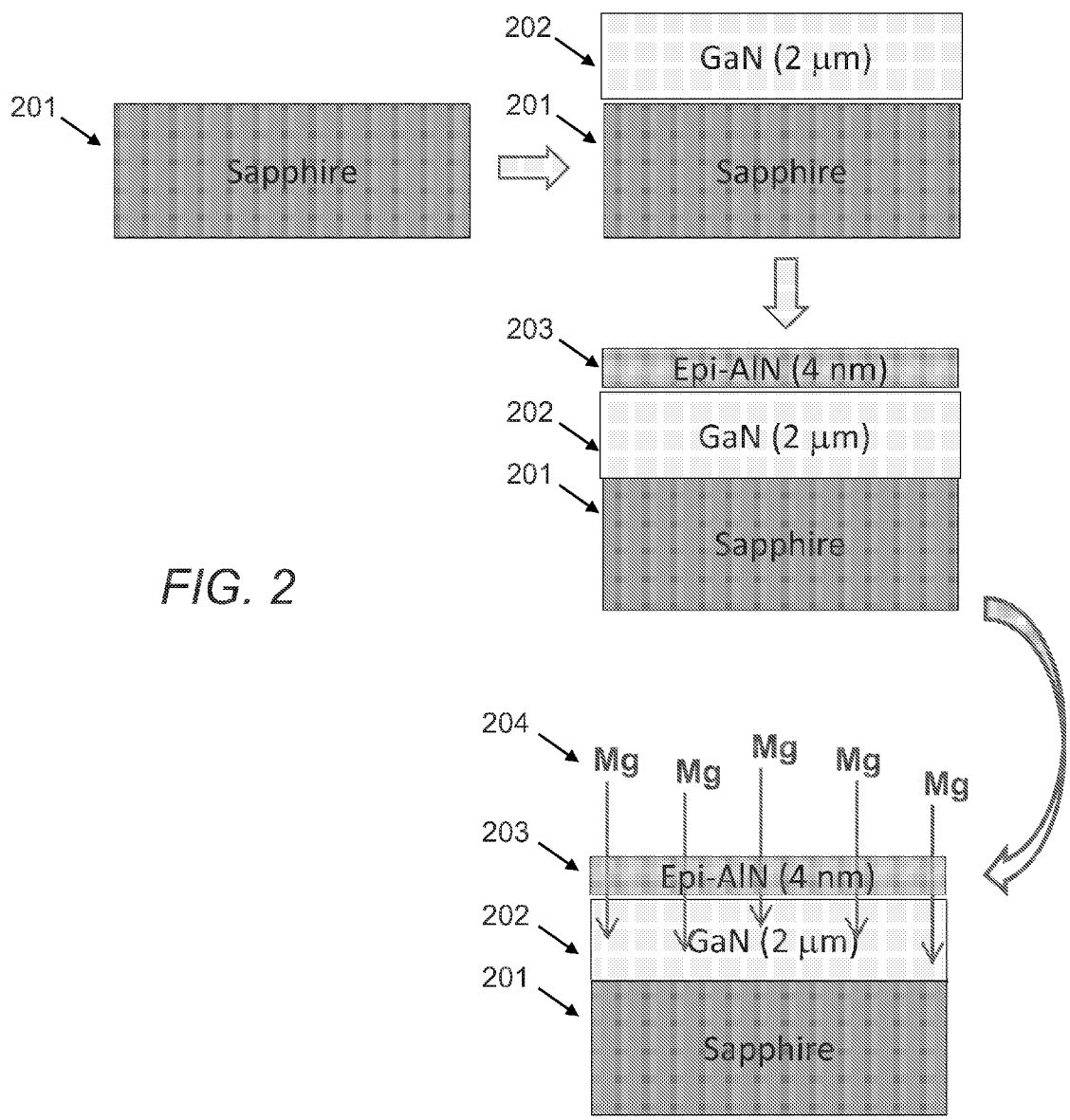
FIG. 2 is a block diagram depicting aspects of an exemplary semiconductor structure configured for defects annealing and impurities activation in accordance with the present invention.

FIG. 2 illustrates an exemplary embodiment of a III-nitride semiconductor sample prepared in accordance with one or more aspects of the present invention. In accordance with the present invention, a sample can be prepared by providing a suitable substrate such as sapphire substrate 201 and depositing thereon a III-nitride semiconductor layer such as GaN layer 202 by any suitable method such as CVD, HVPE, MBE, or any other method for growing GaN. GaN layer 202 is then capped by a thin film 203 of AlN, e.g., by HT AlN MOCVD growth on the top of GaN. The HT MOCVD AlN film is essentially thin to prevent its cracking For example, as shown in FIG. 2, AlN film 203 has a thickness of 4 nm. Of course, other combinations and materials may be possible, so long as the cap is more thermally stable than the GaN. The AlN-capped GaN is then implanted with Mg ions 204 to form a GaN layer doped with Mg. It should be noted that any suitable element or group of elements can be implanted in the GaN to change its electrical, optical, magnetic properties. The cap can be deposited on the GaN before the ion implantation or after, though depositing the cap before implantation is usually preferred.

The implanted GaN sample can then be annealed by the MRTA method described above to subject it to high temperatures for a cumulative long period of time to restore the lattice and activate the implanted ions.

In addition, in other embodiments in accordance with the present invention, the implanted GaN sample can be annealed in two stages as described below.

The first stage of a two-stage annealing process in accordance with some embodiments of the present invention is a preliminary (preparatory) conventional long time annealing (LTA) at a temperature where the GaN sample, protected by the AlN cap and under applied $N_2$ pressure, is stable. In this first stage, the sample is subjected to $N_2$ pressure in the range of 10-100 bar, more preferably in the range of 10-20 bar, and is heated to a temperature about 950-1050° C. for several hours. The application of the $N_2$ pressure in this range of about 10-20 bar is easy to attain using conventional industrial equipment. Applying $N_2$ pressure in this range is crucial for the first stage of annealing. As noted above, according to the GaN phase diagram shown in FIG. 1, the thermal stability of GaN is most sensitive to an increase of pressure from 1 to 20 bar, i.e., the maximum temperature at which GaN is stable increases from about 850° C. at 1 bar to about 960-970° C. at 20 bar. Further increasing the pressure requires more costly equipment and operation, but has a smaller and diminishing effect on GaN thermal stability, and therefore is not so advantageous. However, even at such a relatively low pressure a LTA temperature of the implanted GaN can be raised by about 120° C. without risk of GaN deterioration.

This first annealing stage has two advantageous effects. It improves the stability of the GaN by the partial restoration of the GaN lattice that was damaged by the implantation of the Mg ions, and prepares GaN for the next MRTA stage at higher temperatures. In addition, it decreases the number of the nitrogen vacancies available to trap Mg atoms without their proper activation. The higher the temperature during this first annealing stage, the better is the partial GaN restoration after this stage of annealing.

In the second stage, the implanted GaN sample is annealed by multicycle rapid thermal annealing (MRTA), i.e., a multiple repetition of one cycle of fast heating and fast cooling steps after another, as it was described above.

The AlN cap on the GaN in accordance with the present invention prevents nitrogen evaporation from the GaN surface, and fast cycles of the heating and cooling prevent building up nitrogen pressure underneath the cap. The nitrogen is retained within the GaN, both during the first heating and cooling cycle and during subsequent cycles, which permits the sample to be exposed to the high temperatures above thermodynamic stability of GaN for a long period of time.

Figure 3A:
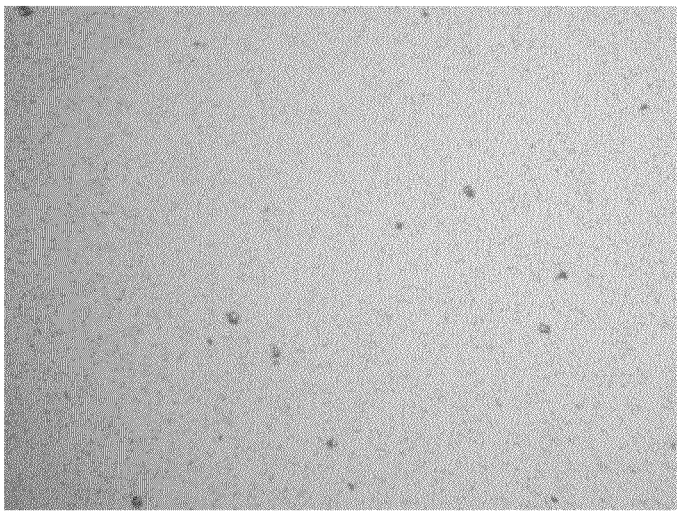
FIGS. 3A-3C are optical images of GaN samples processed using one heating cycle (FIGS. 3A and 3B) and using multi-cycle rapid thermal annealing in accordance with the present invention (FIG. 3C).
Figure 3B:
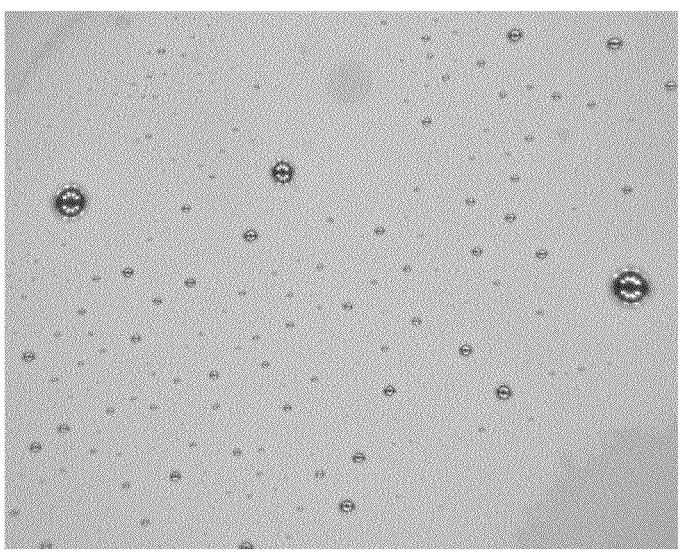
Figure 3C:
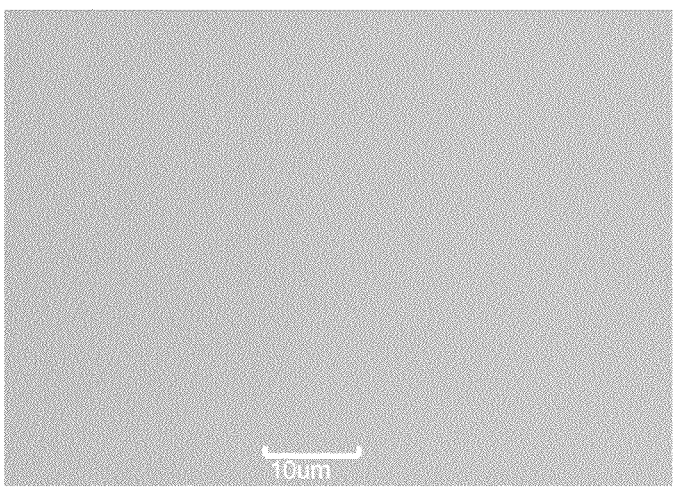
Figure 4:
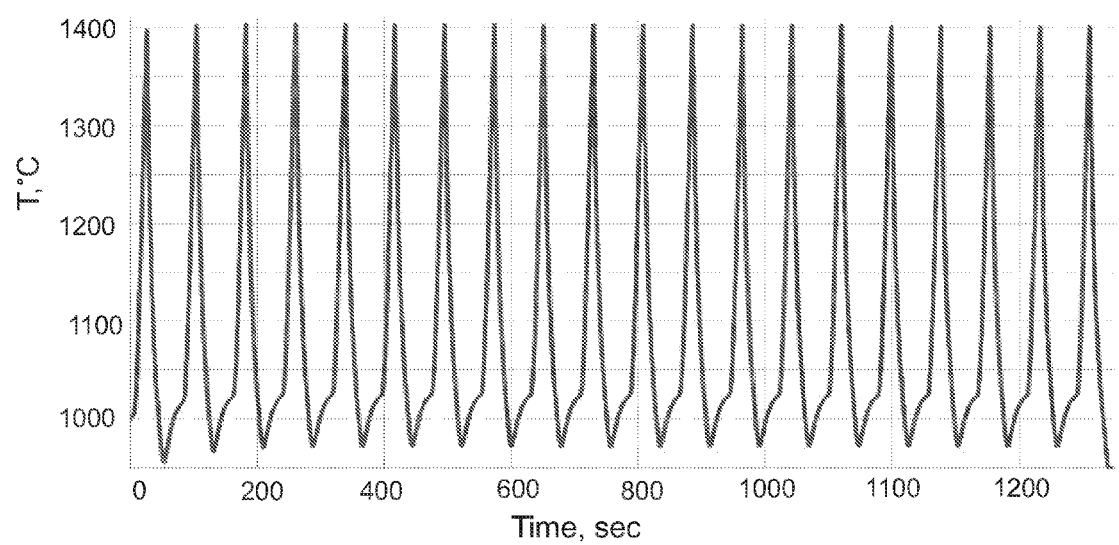
FIG. 4 is a representative plot of the temperature cycling, measured by IR pyrometer during a 40 cycle MRTA in accordance with the present invention.

Aspects of an exemplary case of GaN annealing in accordance with the present invention discussed in more detail below. FIGS. 3A-3C illustrate the effects of annealing an implanted GaN sample in accordance with the present invention. Prior to MRTA experiments we studied the temperature-time parameter space for the one cycle rapid thermal annealing. For example, Mg-implanted GaN samples with HT MOCVD AlN cap did not show signs of surface degradation after one cycle of the rapid annealing at 20 bar of nitrogen pressure, when heating time between 1300° C. and 1400° C. was less than 23 seconds. However, even with the cap, deterioration of the surface occurs when the heating time increases, for instance, up to 31 sec (FIG. 3A). This deterioration can extend to the formation of Ga drops on the surface when the heating time reached only 45 sec (FIG. 3B). In the succeeding MRTA experiments we did not exceed the maximum time and temperature of one cycle found to be safe for a single heating cycle in the preliminary experiments. An example of the MRTA schedule is shown in FIG. 4. Although each cycle is heated between 1300 and 1400° C. for an average of 8.4 sec, by exposing the sample to 40 cycles (only 20 are shown) of this anneal, the total cumulative time between 1300° C. and 1400° C. reaches 5 min 34 sec. The surface of the sample in this example of MRTA (FIG. 3C) maintains continuity, i.e. no cracking or decomposition, as observed after one cycle of RTA with much shorter annealing time (compare images in FIGS. 3A, 3B, and 3C). Thus, the advantage of MRTA lies in the ability to heat the samples for a longer cumulative time at high temperatures above thermodynamic stability of GaN than would be possible in a single RTA cycle or in continuous heating.

Annealing using the MRTA method in accordance with the present invention can be used to improve Mg activation in GaN after doping during growth and to improve activation of other dopants as well. As a result of annealing Mg-implanted GaN in accordance with the present invention, p-type conductivity in the Mg-implanted samples without co-doping enhancement was observed for the first time. The present invention thus also includes a III-nitride semiconductor device with one or more areas having highly activated p-type doping as a result of one or more aspects of the annealing methods described herein.

The present invention also includes a semiconductor composition comprising a substrate, one or more III-nitride epitaxial layers on the substrate, and at least one III-nitride p-type layer having one or more areas with highly activated p-type doping at room temperature.

In some embodiments, the III-nitride epitaxial layer can have a free hole concentration of at least $5 \times 10^{17}$ per $cm^3$ or a sheet resistance of less than less than 9 kΩ/sq (kilo Ohms per square) on or within the III-nitride epitaxial layer.

In other embodiments, the III-nitride epitaxial layer can have even greater p-type conductivity at room temperature, with a free hole concentration of about $1 \times 10^{18}$ per $cm^3$ or a sheet resistance of less than 4.5 kΩ/sq (kilo Ohms per square).

In some embodiments, at least one of the III-nitride epitaxial layers has an N-type dopant concentration.

In addition, annealing of other non-stable materials may benefit by applying the MRTA method.

The method of the present invention will now be described in the context of the following Example, which further illustrates and describes aspects of a method of multicycle rapid thermal annealing in accordance with the present invention.

EXAMPLE

The GaN films used in the study were grown in a Thomas Swan MOCVD reactor on sapphire substrates. The samples consisted of a 25 nm thick low temperature (700° C.) AlN buffer layer, 2 μm thick unintentionally doped GaN layer (1030° C.), followed by a thin AlN capping layer. The AlN cap was 4 nm thick, grown at 1000° C., which was intended to protect the GaN surface during annealing. A single growth run was used to deposit all three layers.

Figure 5:
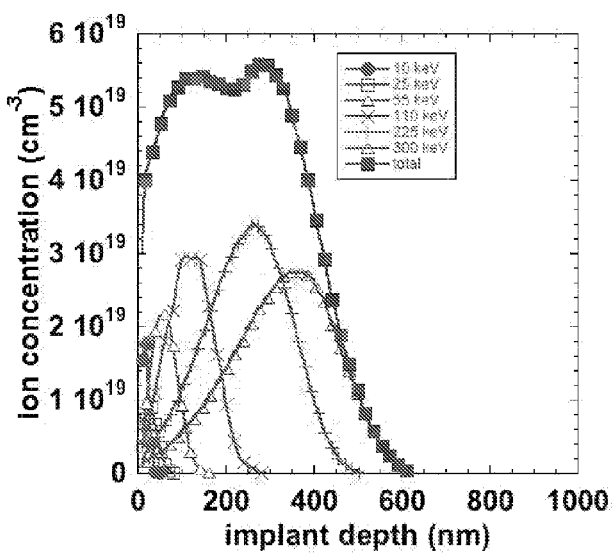
FIG. 5 illustrates Mg implantation profiles for various GaN samples subjected to annealing in accordance with the present invention.
Figure 6:
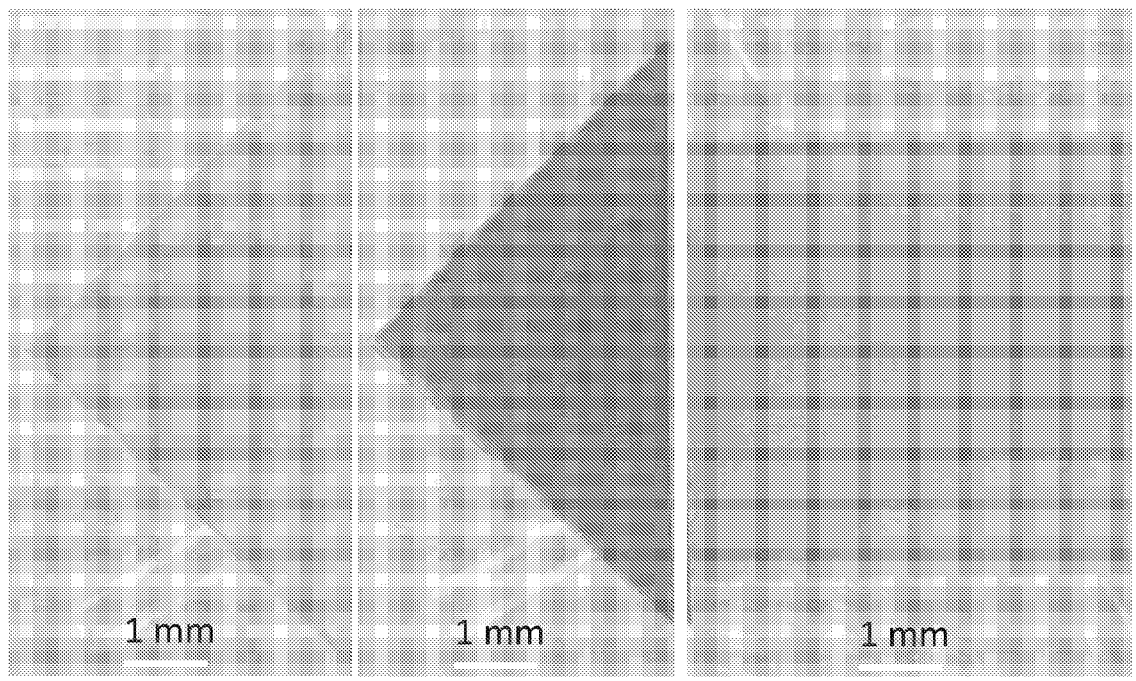
FIGS. 6A-6C are optical images of an exemplary GaN sample as grown before Mg implantation (FIG. 6A), after Mg implantation (FIG. 6B), and after a first annealing stage in accordance with the present invention.

The capped GaN samples then doped via Mg implantation. Implantation of only Mg ions was performed to validate the new annealing technique itself. The Mg implant profile was calculated using TRIM implant simulation software. A multiple energy implant was chosen so that an approximately flat profile would be generated over an appreciable depth, and the total dose was $2 \times 10^{15}$ cm$^{-2}$. The sample was implanted at 500° C. to reduce implantation-induced damage, and the angle was 7° to avoid channeling. The dose and energy profiles of the samples examined are shown in FIG. 5.

In this Example, annealing was conducted with a nitrogen overpressure of 20 bar in a chamber which can withstand $N_2$ overpressure up to 10 MPa (100 bar). A radio-frequency (RF) generator with a graphite susceptor is used for heating. The temperature was measured by a type C thermocouple inside a susceptor 1.0-1.5 mm underneath the sample and with an IR pyrometer, which was focused at the bottom of the graphite susceptor in the proximate vicinity of the sample.

The GaN samples were annealed under a $N_2$ overpressure to stabilize the GaN and extend the annealing temperature range. As noted above, as shown in FIG. 1, the equilibrium nitrogen pressure over GaN increases relatively slowly from 1 bar to 20 bar as the GaN is heated from about 840° C. up to 960° C. but becomes progressively faster when it is heated above 960° C., with a subsequent temperature increase of only 30° C. (960° C. to 990° C.) adding additional 20 bars to the equilibrium $N_2$ pressure. Applying 20 bar of $N_2$ pressure does not require unconventional equipment or difficult techniques, and consequently, it is relatively easy to apply 20 bar of $N_2$ pressure to increase the GaN annealing temperature by 120° C. without GaN dissociation.

In the first annealing step, the samples were conventionally annealed in the same chamber for 1 hour at about 1000° C. As described above the overpressure of nitrogen expands temperature range of GaN stability, and thus the capped GaN can withstand this temperature for a long time without decomposition with the applied 20 bar $N_2$ pressure. This initial anneal is used prior to MRTA as a first step toward partial restoration of the implant-damaged GaN crystal structure with the purpose to make GaN more stable for MRTA at higher temperatures.

The samples were then annealed using the new MRTA process in accordance with the present invention in the range of maximum temperatures between 1380-1420° C. and the number of cycles ranging from 20 to 60. The advantage of MRTA lies in the ability to heat the samples for a longer cumulative time at high temperatures than would be possible in a single heating cycle, since at each cycle of MRTA the maximum annealing time and temperature found to be safe for a single heating cycle is not exceeded. This cumulative time at high temperatures above thermodynamic stability of GaN is significantly longer than the GaN sample could withstand if it were subjected to such temperatures continuously in one heating cycle.

After MRTA, isolated test structures were fabricated on the samples by mesa etching in a $Cl_2$/Ar-based chemistry to a depth of 400 nm. The p-GaN ohmic metal scheme (Ni/Au 20/200 nm) was deposited and annealed by conventional RTA at 600° C. for 1 minute. Prior to metal deposition, another low power $Cl_2$/Ar-based ICP etch was performed to remove the AlN cap layer under the pads and ensure good electrical contact. TLM and van der Pauw patterns were formed for electrical characterization, with a 2 mm square window left open for optical characterization.

Low temperature photoluminescence (PL) measurements were performed to assess the optical and electronic properties of the as grown and MRTA annealed samples. Low temperature (LT) measurements were carried out at 5K with the samples placed in a continuous helium flow cryostat. The samples were excited with the 325 nm line of a HeCd laser, and the excitation intensity was controlled with UV-calibrated neutral density filters. The sample luminescence, collected and focused with spectrometer f-number matching lenses, was dispersed by a double-grating UV-visible-NIR spectrometer fitted with 1800 groves/mm. The spectra were acquired with a UV-extended GaAs photomultiplier tube coupled to a computer-controlled photon counter.

Results and Discussion

Initially colorless samples (FIG. 6A) became brown after implantation (FIG. 6B). This is mainly due to defects induced in the ion implantation, which cause absorption in the visible region. After one hour of annealing at 1050° C., the samples became almost colorless (compare images in FIGS. 6B, 6C), approaching the appearance of the as grown sample (FIG. 6A). These observations are in a good agreement with the results reported by Silkowski et al., "Annealing Study of Ion Implanted MOCVD and MBE Grown GaN," *Mater. Res. Soc. Symp. Proc.* 395 (1996), p. 813, which showed that annealing implanted GaN to 1050° C. in flowing NH3 for 90 min recovered the absorption edge in implanted GaN. This indicates that the first anneal step is partially restoring the GaN crystal structure and most likely make it more stable for the following MRTA.

Figure 7:
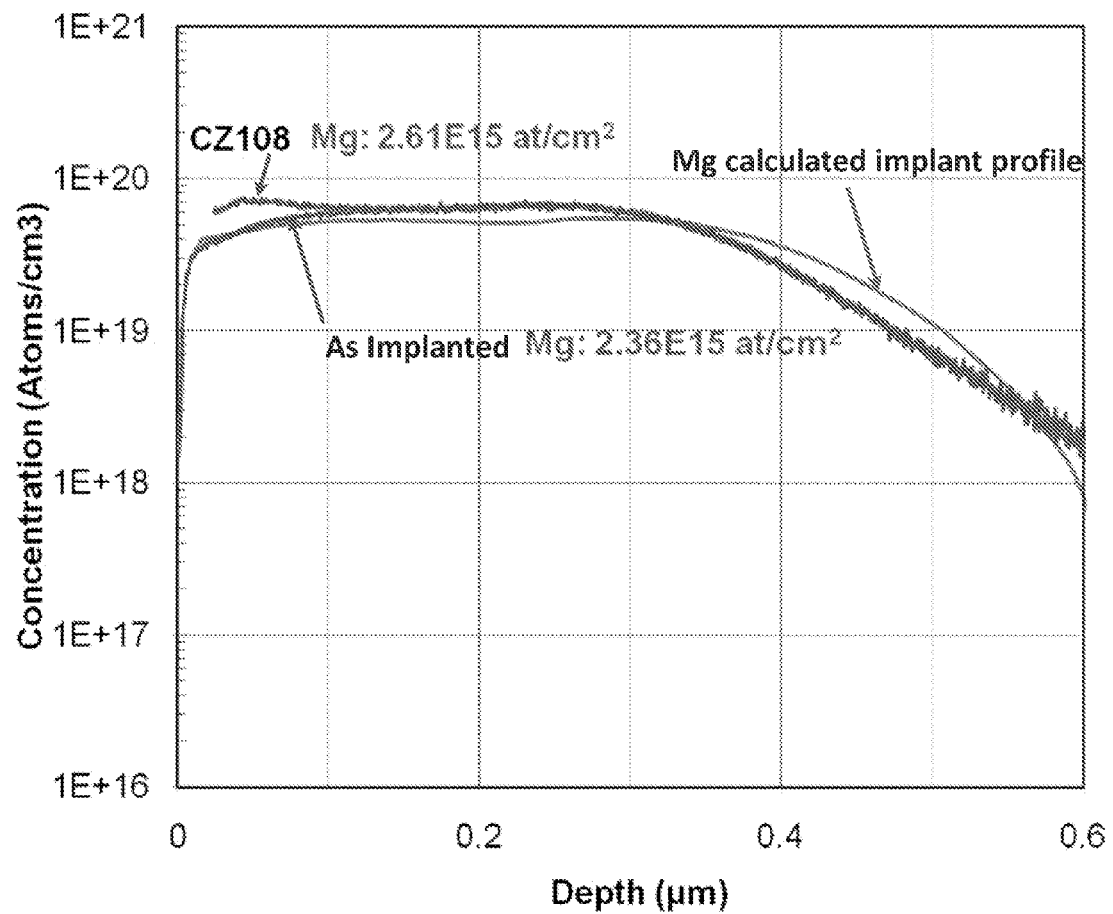
FIG. 7 is a plot illustrating a comparison of simulated implant profile to a SIMS profile of Mg concentration as a function of depth for as-implanted and annealed samples.

Secondary Ion Mass Spectroscopy (SIMS) was used to study the Mg profile in the sample. As shown in FIG. 7, the initial Mg depth profile after implantation correlated very well with the simulated profile, and confirmed the implant dose. Furthermore, after annealing the profile did not change significantly over the bulk of the depth, but an increase in Mg concentration near the surface was observed. This can potentially be attributed to Mg redistribution by diffusion due to the Mg concentration gradient, but the source of the additional Mg is unclear as there is no corresponding decrease in concentration deeper in the sample, therefore this may be a measurement artifact.

After annealing, the test patterns were prepared as previously described, and the samples were characterized electrically and optically.

Electrical measurements were performed to look for evidence of Mg activation. It was found that an undoped and unimplanted reference sample was highly resistive (500 MΩ/, n-type conductivity), while there was an order of magnitude decrease in sheet resistance measured by TLM in the implanted and annealed samples to approximately 2.69 kΩ/in the best case (Sample 132 shown in the Table on FIG. 8). Hall measurements confirmed the sheet resistance value, and confirmed the conduction to be p-type. Based on a Hall hole mobility of 40 cm$^2$/V·s and the calculated total implant depth of ~350 nm, an approximate hole concentration of $1.7 \times 10^{18}$ cm$^{-3}$ is extracted from the electrical measurement. This represents an activation of ~8.2% of the implanted Mg atoms. The I-V characteristics of two Mg-implanted after MRTA p-type samples compared to the unintentionally doped n-type sample are shown in FIG. 8.

Figure 8:
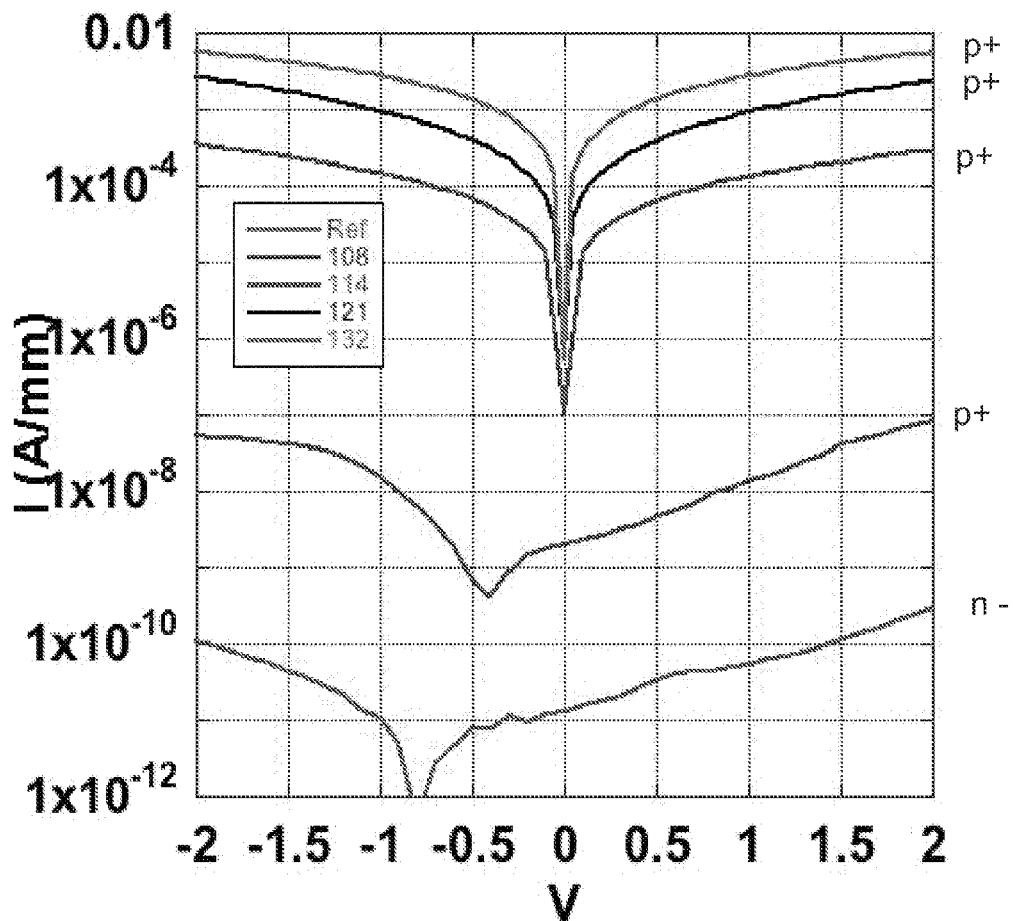
FIG. 8 depicts I-V curves for an as-grown GaN sample, which is unintentionally doped and exhibits n-type conductivity and for an Mg-implanted GaN samples subjected to annealing in accordance with the present invention.
Figure 9:
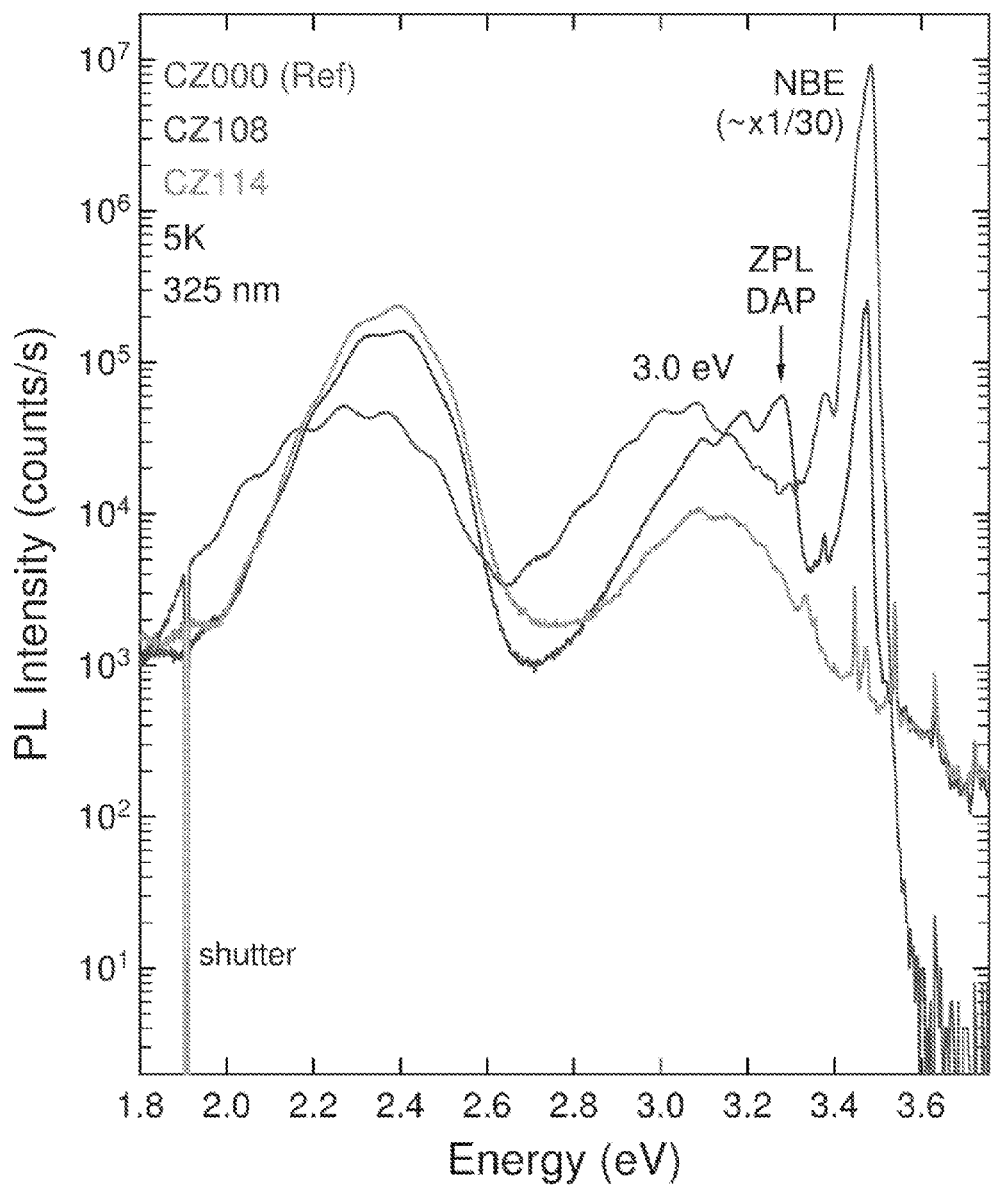
FIG. 9 depicts an LT photoluminescence spectra of one as-grown Mg sample and two GaN samples annealed in accordance with the present invention.

FIG. 8 depicts the 5K PL spectra of an as grown (CZ000) and two Mg-implanted (CZ108 and CZ114) samples after MRTA in the spectral region between 1.80 eV and 3.76 eV. The spectrum of the reference sample is dominated by the sharp emission line at 3.47 eV, represented in the figure by NBE (Near Band Edge emission), which is assigned to recombination processes associated with the annihilation of free excitons and excitons bound to shallow impurities such as Si and O donors, and shallow acceptors. See J. A. Freitas, Jr. et al., "Donor-related recombination processes in hydride-vapor-phase epitaxial GaN," *Phys. Rev. B.* 66 (2002) 233311; M. Murthy et al., "Residual impurities in GaN substrates and epitaxial layers grown by various techniques," *J. Crystal Growth* 305 (2007) 393.

Also observed are two broad emission bands at ~2.25 eV and ~3.05 eV. The former is the so called "yellow luminescence" and the latter is often observed in the PL spectra of un-doped and C-doped high resistivity GaN films. See M. A. Reshchikov et al., "Luminescence properties of defects in GaN," *J. Appl. Phys.* 97 (2005) 061301; A. E. Wickenden et al., "The Influence of OMVPE Growth Pressure on the Morphology, Compensation, and Doping of GaN and Related Alloys," *J. Electron. Mat.* 29 (2000) 21, R114; and R. Armitage et al., "Analysis of the carbon-related "blue" luminescence in GaN," *J. Appl. Phys.,* 97 (2005) 073524. The NBE emission line is absent from the low temperature PL spectra of the irradiated samples (not shown), and both broad emission band intensities are strongly reduced. The high energy spectral region of the luminescence spectrum of the annealed sample CZ114 shows that the NBE emission line is still missing, and has been replaced by sharp lines associated with resonant optical phonon lines. See W. H. Sun et al., "Outgoing multiphonon resonant Raman scattering and luminescence in Be- and C-implanted GaN," *J. Appl. Phys.* 91 (2002) 4917).

These observations indicate that this sample did not fully recover from the implantation damage after the thermal annealing treatment, despite sizable increase of the broad emission band intensities. Note that the band at 2.25 eV has been replaced by a broad emission band with peak near 2.4 eV. Also note that the band at ~3.05 eV has been replace by a broad emission band with peak near 3.15 eV. The NBE emission line is observed in the high energy spectral region of the PL spectra of sample CZ108, indicating that the thermal annealing procedure has resulted in a partial or full implantation lattice damage recovering. In addition to the NBE line, we also observed in this sample spectrum, a broad multiple peaks band centered near 3.2 eV. This band has been assigned to emission process involving the recombination of electrons bound to shallow donors with holes bound to shallow acceptors, or donor-acceptor pair (DAP) band with zero phonon line (ZPL) of about 3.27 eV. Since we have intentionally introduced Mg ions in the lattice, it is fair to assume that Mg ions are the shallow acceptors associated with this emission band. See B. Monemar et al., "Evidence for Two Mg Related Acceptors in GaN," *Phys. Rev. Lett.* 102 (2009) 235501.

It is difficult to extract hole concentration from PL experiments, considering that there is not a simple and accurate approach to estimate the contribution from each radiative and non-radiative recombination channel. However, NBE emission peak intensity reduction of the Mg-implanted/annealed sample by approximately two orders of magnitude relative to the as-grown sample can be associated with partial compensation of the shallow donors by the activated Mg ions.

A new annealing technique, termed Multicycle Rapid Thermal Annealing (MRTA) has been developed to enable annealing of GaN layers. This process employs numerous short-cycle heating steps to achieve an extended time at temperatures above the thermodynamically stable regime for GaN. The technique has been proven by the demonstration of electrically active acceptors after Mg implantation in GaN, and for the first time p-type conductivity in Mg-implanted samples without co-doping enhancement was observed. This technique will be also applied to improve Mg activation in GaN after doping during growth and to improve activation of other dopants as well. In addition, annealing of other non-stable materials may benefit by applying the MRTA method.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A process for annealing a III-nitride semiconductor without decomposing, the process including:
   capping a III-nitride semiconductor sample with a cap made from a material that is thermodynamically stable at an annealing temperature;
   positioning the capped III-nitride semiconductor sample inside an enclosure;
   charging the enclosure with one of an inert gas, nitrogen, ammonia, and mixtures thereof at an applied gas pressure above one atmosphere; and
   subjecting the capped III-nitride semiconductor sample to a plurality of heating and cooling cycles without removing the sample from the enclosure, each heating and cooling cycle including
   (1) rapidly heating the sample for a duration of several seconds to a temperature T1 higher than a temperature Ts, Ts being a temperature above which the III-nitride semiconductor sample becomes thermodynamically unstable at the applied gas pressure; and
   (2) rapidly cooling the sample for a duration of several seconds to a temperature T2, T2 being a temperature below Ts where the sample just becomes thermodynamically stable;
   wherein during each heating and cooling cycle the sample is exposed to an elevated temperature range between Ts and T1 for a predetermined time period t1 without decomposing, t1 being less than a time t2 at which the sample would start to decompose at the elevated temperature range; and
   wherein at the end of the plurality of heating and cooling cycles, the sample has been heated to a temperature in the elevated temperature range for a total cumulative time t3 greater than t2, without the sample decomposing.

2. The process according to claim 1, wherein the cap comprises a III-nitride cap.

3. The process according to claim 2, wherein the III-nitride cap is applied to the III-nitride semiconductor by means of MOCVD.

4. The process according to claim 1, wherein the III-nitride semiconductor is GaN.

5. The process according to claim 4, further comprising applying a thin AlN cap to the GaN.

6. The process according to claim 5, wherein the AlN cap is applied to the GaN by means of MOCVD.

7. The process according to claim 6, wherein the AlN cap is applied to the GaN by means of high temperature MOCVD at about 1000° C.

8. The process according to claim 7, wherein the AlN cap has a thickness of about 2-10 nm.

9. The process according to claim 6, wherein the AlN cap comprises a first layer of AlN deposited by MOCVD at a temperature of about 1000° C. and a second layer of AlN deposited by MOCVD at a temperature below 1000° C.

10. The process according to claim 4, wherein the applied gas pressure is about 20 bar.

11. The process according to claim 10, wherein the gas is nitrogen.

12. A process for annealing a III-nitride semiconductor without decomposing, the process including:
 implanting a III-nitride semiconductor sample with a plurality of dopant ions to form a doped III-nitride semiconductor sample;
 capping the doped III-nitride semiconductor sample with a cap made from a material that is thermodynamically stable at an annealing temperature;
 positioning the capped doped III-nitride semiconductor sample inside an enclosure;
 charging the enclosure with one of an inert gas, nitrogen, ammonia, and mixtures thereof at an applied gas pressure above one atmosphere; and
 subjecting the capped doped III-nitride semiconductor sample to a plurality of heating and cooling cycles without removing the sample from the enclosure, each heating and cooling cycle including
  (1) rapidly heating the sample for a duration of several seconds to a temperature T1 higher than a temperature Ts, Ts being a temperature above which the III-nitride semiconductor sample becomes thermodynamically unstable at the applied gas pressure; and
  (2) rapidly cooling the sample for a duration of several seconds to a temperature T2, T2 being a temperature below Ts where the sample just becomes thermodynamically stable;
 wherein during each heating, and cooling cycle the sample is exposed to an elevated, temperature range between Ts and T1 for a predetermined time period t1 without decomposing, t1 being, less than a time t2 at which the sample would start to decompose at the elevated temperature range; and
 wherein at the end of the plurality of heating and cooling cycles, the sample has been heated to a temperature in the elevated temperature range for a total cumulative time t3 greater than t2, without the sample decomposing.

13. The process according to claim 12, wherein the cap comprises a III-nitride cap.

14. The process according to claim 13, wherein the III-nitride cap is applied to the III-nitride semiconductor by means of MOCVD.

15. The process according to claim 12, wherein the cap is applied before implantation of the dopant ions.

16. The process according to claim 12, wherein the cap is applied after implantation of the dopant ions.

17. The process according to claim 12, further comprising annealing the sample at a temperature T3 below Ts before the beginning the first of the plurality of heating and cooling cycles.

18. The process according to claim 12, wherein the III-nitride semiconductor is GaN.

19. The process according to claim 18, further comprising applying an AlN cap to the GaN.

20. The process according to claim 19, wherein the AlN cap is applied to the GaN by means of MOCVD before the implantation of the dopant ions.

21. The process according to claim 18, wherein the AlN cap is applied to the GaN by means of high temperature MOCVD at about 1000° C.

22. The process according to claim 21, wherein the AlN cap has a thickness of about 2-10 nm.

23. The process according to claim 22, wherein the AlN cap comprises a first layer of AlN deposited by MOCVD at a temperature of about 1000° C. and a second layer of AlN deposited by MOCVD at a temperature below 1000° C.

24. The process according to claim 18, wherein the GaN sample is implanted with Mg ions.

25. The process according to claim 24, wherein after annealing, the GaN sample implanted with Mg ions shows high p-type conductivity with sheet resistance $R_{SH}$ below 9 $k\Omega/sq$.

26. A product of the process of claim 1.

27. A product of the process of claim 12.

28. The process according to claim 1, wherein the III-nitride semiconductor is one of GaN, InN, AN and their alloys.

29. The process according to claim 10, wherein t1 is about 8 seconds.

30. The process according to claim 10, wherein T1 is between about 1300° C. and about 1400° C.

31. The process according to claim 30, further comprising heating and cooling the capped III-nitride semiconductor sample for 40 cycles, wherein t3 after the 40 cycles is about 5 minutes, 30 seconds.

32. The process according to claim 12, wherein the cap is applied before the implantation of the dopant ions.

33. The process according to claim 17, wherein T3=T2.

34. The process according to claim 18, wherein the applied gas pressure is 20 bar.

35. The process according to claim 34, wherein t1 is about 8 seconds.

36. The process according to claim 34, wherein T1 is between about 1300° C. and about 1400° C.

37. The process according to claim 36, further comprising heating and cooling the capped III-nitride semiconductor sample for 40 cycles, wherein t3 after the 40 cycles is about 5 minutes, 30 seconds.

* * * * *